United States Patent [19]

Huang et al.

[11] Patent Number: 5,639,345
[45] Date of Patent: Jun. 17, 1997

[54] TWO STEP ETCH BACK PROCESS HAVING A CONVEX AND CONCAVE ETCH PROFILE FOR IMPROVED ETCH UNIFORMITY ACROSS A SUBSTRATE

[75] Inventors: Yuan-Chang Huang, Hsin-chu; Yu Chen-Hua Douglas, Keelung, both of Taiwan

[73] Assignee: Taiwan Semiconductor Manufacturing Company Ltd., Hsin-chu, Taiwan

[21] Appl. No.: 587,127

[22] Filed: Jan. 11, 1996

[51] Int. Cl.[6] .................................................. H01L 21/00
[52] U.S. Cl. ........................... 156/657.1; 156/636.1; 156/643.1; 216/38; 437/228 PL; 437/238
[58] Field of Search .......................... 156/636.1, 643.1, 156/657.1, 659.11, 662.1; 216/38, 67; 252/79.1; 437/195, 228 PL, 238

[56] References Cited

U.S. PATENT DOCUMENTS 4,775,550 10/1988 Chu et al. ................................. 427/38
5,366,850 11/1994 Chen et al. ........................ 437/238 X Primary Examiner—William Powell
Attorney, Agent, or Firm—George O. Saile

[57] ABSTRACT

A novel method for improving the etch back uniformity for inter-metal-dielectric planarization was accomplished. Conventional single etch backs use a high polymer chemistry gas mixture ($CF_4/CHF_3$) to etch back the planar spin-on-glass (SOG) layer to a conformal insulating barrier layer over a patterned metal. The polymer producing etch gas eliminates micro-loading effects by providing the required selectivity (about 1.6) between the insulating barrier layer and SOG for good planarization, but results in poor etch back uniformity (about 12 to 15%) across the wafer when the SOG is etched. The improved method, of this invention, uses a partial first etch back in a downstream etcher using $CF_4/O_2$ having a etch rate that decreases from center to edge of wafer, thereby forming a convex SOG etch rate profile. The remaining SOG layer is then etched to the insulating barrier layer in the $CF_4/CHF_3$ etch gas having an etch rate that increases from center to edge of wafer. The characterisic convex etch rate profile of the first etch back compensates for the second etch back (concave etch rate profile) resulting in excellent total etch back uniformity (about 4%), while the second etch back in $CF_4/CHF_3$ provides the required selectivity for planarization.

22 Claims, 7 Drawing Sheets

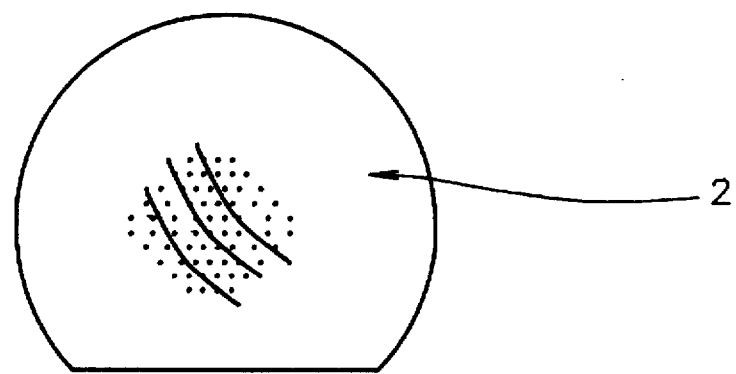
FIG. 1 - Prior Art
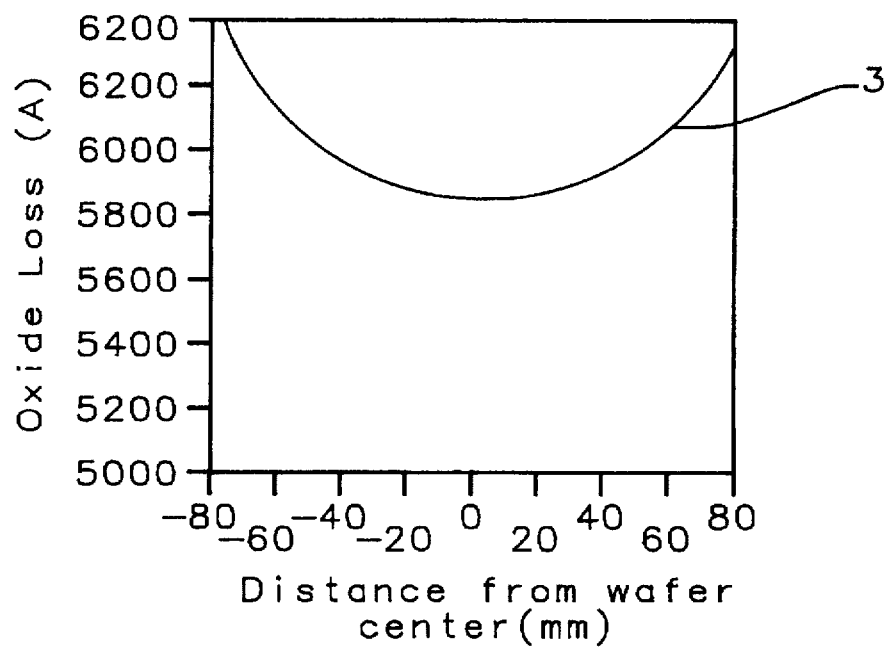
FIG. 2 - Prior Art

TWO STEP ETCH BACK PROCESS HAVING A CONVEX AND CONCAVE ETCH PROFILE FOR IMPROVED ETCH UNIFORMITY ACROSS A SUBSTRATE

BACKGROUND OF THE INVENTION

1. Field of the Invention

The present invention relates to a method for planarizing insulating layers on semiconductor substrates and more particularly, relates to a method for etching back and planarizing the spin-on-glass (SOG) for Inter-Metal-Dielectric (IMD) layers using a two-step etch back process, and thereby forming a more uniform IMD layer.

2. Description of the Prior Art

In today's Very Large Scale Integration (VLSI) and Ultra Large Scale Integration (ULSI) on semiconductor substrates patterned multilayer conductors are used to electrically interconnect the semiconductor devices in, and on, the substrate. Inter-metal-dielectric (IMD) layers are used between the patterned conducting layers to provide insulation. To achieve high circuit density, high resolution photolithographic techniques and directional (anisotropic) plasma etching has now replaced wet etching to pattern the conducting layers. However, the accumulated effect of depositing and patterning these conducting layers, one patterned layer on top of the other, has resulted in irregular or substantially non-planar microscopic surface features on an otherwise microscopically planar substrate. This rough or irregular topography also results from other structures on the substrate, such as semiconductor devices formed in and on the substrate surface. The rough topography becomes substantially worse at later processing steps when the multilayer metallurgy is used to wire-up the discrete devices for integrated circuits.

This rough topography causes a number of processing problems. For example, the present day high resolution photolithography require more shallow depths of focus during optical exposure of the photoresist, and this leads to unwanted distorted photoresist images over the non-planar portions of the substrates. Another problem can occur during anisotropic plasma etching to define the conducting lines. Due to the directional nature of the etching, unwanted residual portions of the conducting layer, usually referred to as rails, can remain on the sidewalls of the underlying patterns which can then lead to interlevel shorts. In addition, the thinning of the narrow interconnecting metal lines over steps in underlying patterned layers during the deposition can result in low yield and early failure of the circuit. This is especially true at high current densities where electromigration of the metal atoms in the metal lines can lead to voids and open lines, or can result in extrusion of metal between the closely spaced lines leading to shorts.

One important approach of minimizing these topographic problems is to planarize the inter-metal-dielectric layer over the patterned conducting layer, thereby preserving the planar nature of the substrate surface on which the next level of patterned conductive layers are formed. This planarization requirement is particularly important at the number of patterned multilayer metal levels increase where the accumulative roughness of the surface topography can be quite severe.

Various methods have been used for planarizing the dielectric layers. For example, bias sputtered silicon oxide and biased plasma enhanced chemical vapor deposition (PECVD), have been used to partially planarize the layer. Another method is to deposit a low melting temperature, such as a phosphosilicate glass (PSG) or borophosphosilicate glass (BPSG) and then thermally anneal the substrate. More recently, new techniques using Spin-On-Glasses (SOG) are being used as part of the interlevel insulators to form the planar insulating layer.

The spin-on-glass is of particular interest because the deposition process and planarization is relatively simple and the process utilizes low cost equipment. For example, the insulating layer is deposited by spin coating a liquid precursor, similar to the spin coating application of photoresist. The layer is then dried to remove the solvents and baked on a hot plate or in an oven to cure the layer and to form an inorganic oxide by pyrolysis. The spin coating application of the liquid precursor composed of a solvent containing, for example, a silicate or siloxane polymer tend to fill in the recesses between the patterned metal areas being thicker than the coating over the metal areas, thereby essentially forming an insulator with a planar surface over the patterned conducting layer. One disadvantage of SOG is out-gassing of $H_2O$ molecules or water that can cause erosion of the patterned conducting layer, especially the metal conductors. Therefore, it is common practice in the semiconductor industry to deposit a conformal silicon oxide ($SiO_2$) barrier layer, such as a chemical vapor deposited (CVD) oxide, over the underlying patterned metal layer before coating the substrate (wafer) with SOG. The SOG is then blanket etched back to this first CVD oxide barrier layer over the metal areas leaving the SOG in the trenches between the patterned conducting layer, and forming an essentially planar surface. A second CVD oxide barrier layer is deposited on the SOG in the trenches and on the exposed first CVD oxide barrier layer over the patterned conducting layer. Contact openings for the next conducting layer are then etched only in the CVD oxide regions over the conducting layer, thereby avoiding the out gassing from the SOG. This type of planarizing process is described in U.S. Pat. No. 4,775,550, by Chu, et al, entitled "Surface Planarization Method For VLSI Technology".

Although the use of spin-on-glasses can provide an effective method for forming a planar insulating layer on multilevel metallurgies, it is important to etch back the SOG uniformly across the substrate. Unfortunately, the etch back uniformity can be quite poor for a number of reasons. For example, the initial SOG coating is typically nonuniform due to the spin coating inertia during coating being about 3 percent thicker at the wafer center for a 6000 Angstrom thick coating. Due to the etching characteristics (loading effect across the wafer) of a typical plasma etcher the etch rate at the center of the wafer is also slower by about 3 to 4 percent. Still another problem occurs when a high polymer etch chemistry is used to achieve good planarization over the bulk of the wafer surface. Typically a gas mixture is used, such as trifluoromethane ($CHF_3$) and carbon tetrafluoride ($CF_4$), to increase the etch selectivity of the underlying CVD oxide to the SOG. Although the selective etch compensates for the micro-loading effect when the SOG layer is etched to the CVD oxide barrier layer providing for the improved planarization, it also adversely effects the etch uniformity during the SOG etching by forming a polymer film 2 at the wafer center, as depicted in FIG. 1, and the poor etch back profile due to this polymer is shown in FIG. 2 by plotting the oxide loss (oxide etched off the wafer) in Angstroms as a function of distance across a 150 millimeter diameter wafer, as depicted by curve 4 in FIG. 2. The accumulative effect of the above non-uniformity contributors is typically between about 12 to 15 percent. Also shown in FIG. 3 by curve 7 is the correlation of the selectivity between the insulating barrier layer, such as a plasma enhanced CVD oxide, and the SOG as a function of the etch back uniformity across the wafer for the conventional $CHF_3/CF_4$ plasma etch. The degradation in uniformity is clearly seen with improved selectivity.

This poor uniformity can adversely effect the product (chip) yield on the wafer by over etching alone the perimeter of the wafer while just clearing the SOG at the wafer center. For example, if the over etching erodes the underlying conducting layer, such as a tungsten metallurgy, redeposition of metal residue can result in electrical shorts. Therefore, there is still a strong need to improve the etch uniformity across the wafer while retaining the desirable attributes, such as the high selective etch of CVD oxide to SOG necessary for good planarization.

SUMMARY OF THE INVENTION

It is therefore an object of this invention to improve the etch back uniformity of a spin-on-glass layer used in the formation of a planar inter-metal-dielectric (IMD) layer on a substrates.

It is a further object of this invention to improve the etch back uniformity using a two-step process consisting of a plasma etch having a convex etch profile and a plasma etch having a concave etch profile across the diameter of the wafer.

It is yet another object to this invention to provide a process for making multilayer planar dielectric layers over a patterned conducting layer by the above etch-back method while providing a cost effective manufacturing process.

These and other objectives of the invention are achieved by applying a two-step etch back process using sequentially etch backs that have a convex and concave etch profile across the substrate. The method is applied to a partially completed semiconductor substrate having semiconductor devices formed in and on the substrate surface, and further having a patterned electrically conducting layer that provides the interconnecting wiring to the devices contacts. Typically the patterned conducting layer is a tungsten (W) metallurgy or, alternatively, an aluminium (Al) metallurgy can be used with a refractory barrier layer. The refractory layer prevents Al penetration (spiking) in the substrate that would otherwise electrically device degradation.

A conformal insulating barrier layer is deposited next over the patterned conducting layer to protect the metallurgy from the eroding effects of the spin-on-glass (SOG) that would occur during processing. The spin-on-glass is applied next by spin coating. The SOG, such as a siloxane type, is coated to a thickness sufficient to fill in the recesses or trenches between the patterned conducting layer, thereby forming essentially a smooth planar surface. In the prior art a total etch back is usually used to etch back the SOG to the surface of the insulating barrier layer. Unfortunately, it is difficult to achieve an etch back that just clears the SOG off the insulating barrier layer without over etching along the perimeter of the substrate, and concurrently provides the correct etch selectivity between SOG and the underlying insulating layer to compensate for the micro-loading effect necessary for good planarization. This non-uniform etch back problem is avoided, by the method of this invention, by using a two step etch back in which the first etch back is a partial etch having a convex etch profile in which the remaining SOG after the partial etch is thicker on the perimeter of the substrate. This convex profile can be achieved in a downstream type plasma etcher. The second etch back is a typical etch having a concave etch profile and the required etch rate selectivity, and the SOG is etched to the surface of the insulating barrier layer over the patterned conducting layer. The amount (thickness) of the SOG removed by two etch backs are optimized to provide good etch back uniformity across the substrate while the second etch back provids good planarization of the spin-on-glass in the recesses with the insulating layer over the patterned conducting layer. The surface of the SOG being essentially coplanar with the surface of the insulating barrier layer.

The inter-metal-dielectric layer is then completed by depositing a second insulating barrier layer to cap the SOG and ready the substrate for the next level of patterned conducting layer. The method of this invention is then repeated to form the inter-metal-dielectric layer for the next level of metal and subsequent levels.

BRIEF DESCRIPTION OF THE DRAWINGS

FIG. 1 is a schematic top view of a substrate (wafer) depicting the polymer build-up that occurs at wafer center during the typical single step etch back using a high polymer chemistry plasma etching in $CHF_3/CF_4$.

FIGS. 2 is a graph of the non-uniform etch back profile for the single step etch back of FIG. 1.

DESCRIPTION OF THE PREFERRED EMBODIMENTS

The two step etch back process, of this invention, utilizes the difference in the etch rates profiles across the substrate between the first etch back and the second etch back to achieve an essentially uniform etch back across substrate (wafer). The second etch back, however, maintains the proper etch selectivity between the SOG and the underlying insulating barrier layer to provide a good planarization over the patterned conducting layer.

Prior to discussing the invention for improving the etch back uniformity, a brief review of the partially completed semiconductor substrate on which the etch back is used would be helpful in understanding the invention. Although the invention is described for the planarization of inter-metal-dielectrics for integrated circuit devices on silicon substrates, it should be well understood by those skilled in the art that the method can be equally applied to other types of semiconductor substrates or other types of substrates where planar electrical interconnections are required.

Figure 3:
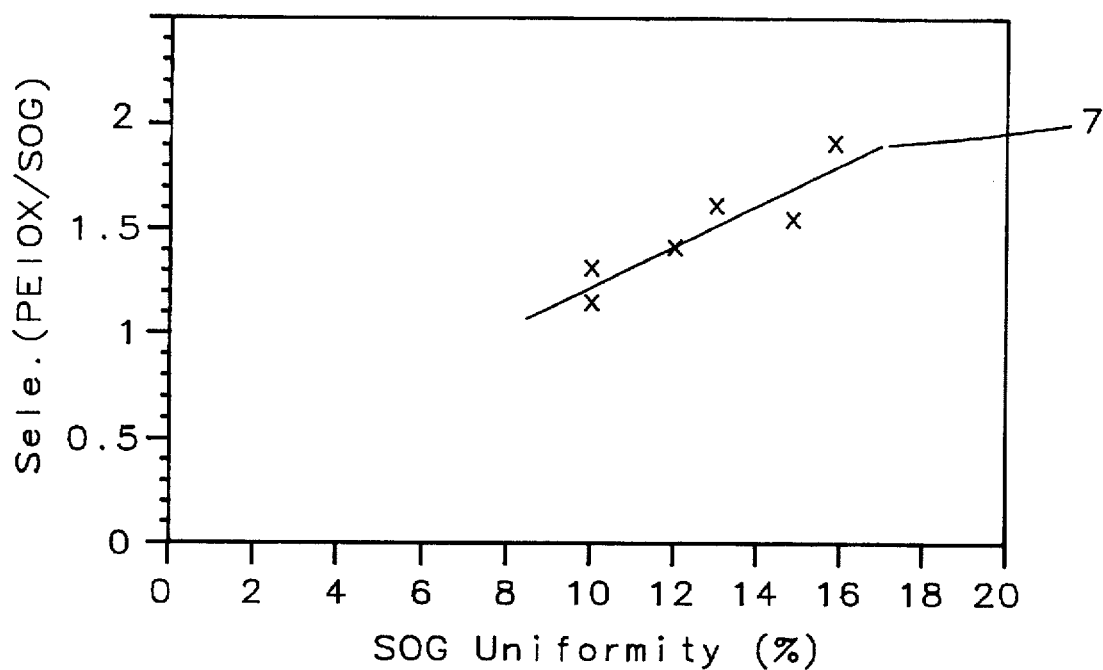
FIG. 3 is a plot showing the dependence of the etch selectivity of a PECVD oxide barrier layer to SOG as a function of the etch uniformity across the wafer.
Figure 4:
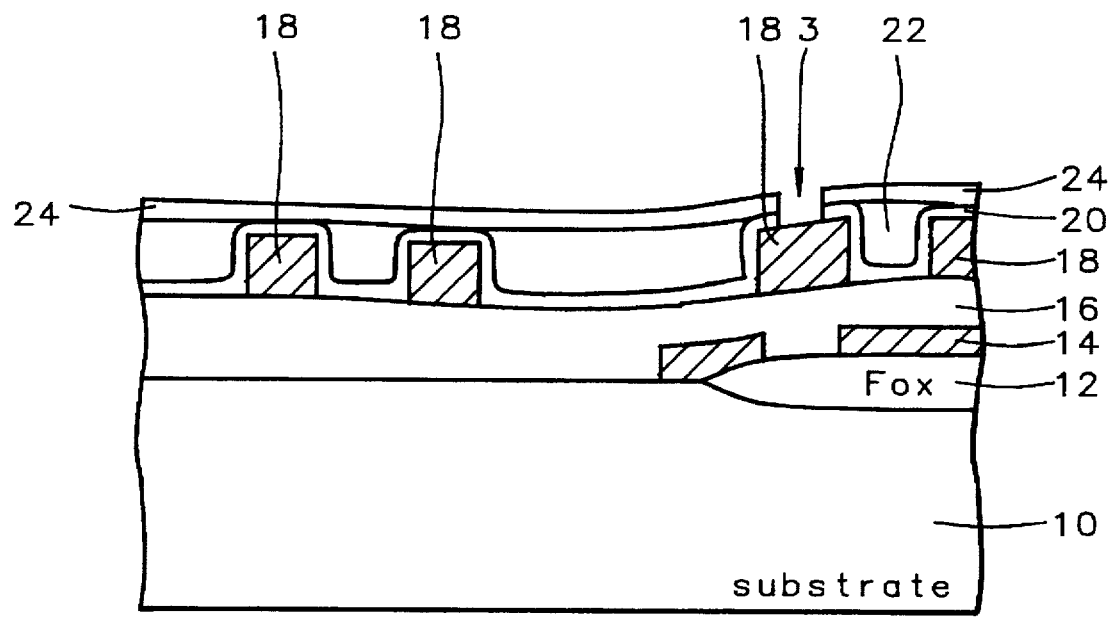
FIGS. 4 is a schematic cross sectional view of a portion of a substrate (wafer) having partially completed semiconductor circuit showing the formation of the inter-metal dielectric layer on a first level patterned metal layer.

Referring now to FIGS. 4, a schematic cross sectional view is shown of a portion of a substrate 10 having on the surface a partially completed integrate circuit. The most commonly used substrate is typically composed of single crystal silicon having typically a <100> crystallographic orientation. A field oxide (FOX) 12 is formed on and in the substrate surface to electrically isolate the semiconductor devices. A common type of field oxide used on the silicon substrate is formed by the LOCOS method (LOCal Oxidation of Silicon) in which a patterned silicon nitride (not shown) is used as a barrier mask to thermal oxidation. The silicon surface is then selectively oxidized to form the field oxide 12, as shown in FIG. 4. The FOX is typically grown to a thickness of between about 3000 to 5000 Angstroms. Semiconductor devices (not shown) are then formed in and on the substrate surface. Typically a polysilicon or polysilicon/silicide layers 14 is patterned by conventional means using photolithographic techniques and anisotropic etching to form parts of the device, such as the FET gate electrodes for field effect transistors (FETs) and for forming some of the inter-connections. An insulating layer 16, usually composed of silicon oxide ($SiO_2$), is deposited next to insulate the semiconductor devices and polysilicon/silicide interconnects from the interconnecting metallurgy 18 which is then formed on the insulating layer 16. The insulating layer 16 is typically composed of a CVD oxide. Alternatively, layer 16 can be composed of a CVD oxide layer and a low temperature glass layer, such as a borophosphosilicate glass (BPSG) to provide an essentially planar surface after a thermal anneal. Typically, the total thickness of layer 16 is between about 6000 to 10000 Angstroms. After forming contact openings (not shown) in layer 16 to the required devices, the next level of interconnecting metal is formed by physical vapor deposition, such as sputtering or evaporation of aluminum (Al) or an aluminum/copper alloy and then patterning the layer. An alternative metallurgy such as the refractory tungsten (W) metal can also be used for layer 18 and can be deposited by CVD using, for example, tungsten hexafluoride ($WF_6$). The layer 18 is then patterned by conventional photolithographic techniques and anisotropic plasma etching to define the interconnecting metallurgy. The preferred thickness of the metal layer 18 is in a range of between about 4000 to 8000 Angstroms.

Still referring to FIG. 4, an inter-metal-dielectric (IMD) layer is formed next by depositing a conformal insulating barrier layer 20, preferably composed of a silicon oxide ($SiO_2$). Barrier layer 20, provides protection from corrosion of the interconnecting metal layer 18 from out diffusion of moisture, such as water or H–O molecules, from the spin-on-glass (SOG) which is deposited next. The barrier insulating layer 20 is preferably deposited by plasma enhanced chemical vapor deposition (PECVD). For example the CVD oxide can be deposited in a plasma reactor using a gas mixture containing silane ($SiH_4$) and nitrous oxide ($N_2O$) or oxygen ($O_2$). The preferred thickness of the insulating barrier layer 20 is between about 7000 to 14000 Angstroms.

Referring still to FIG. 4, a spin-on-glass (SOG) layer 22 is deposited on the insulating layer 20 by spin coating. The spin-on-glass flows into the recesses or trenches between the patterned metal layer 18 forming an essentially planar surface. The spin-on-glass is then blanket etched back to the surface of the barrier insulating layer 20 over the metal layer 18 while leaving the spin-on-glass in the recesses, thereby forming a planar insulating layer. Typically in a convention etch back method the SOG is etched back in a single step. A second barrier insulating layer 24, having also a thickness between about 2000 to 4000 Angstroms is then deposited by PECVD similar to the deposition method of the first insulating barrier layer 20, thereby completing the inter-metal dielectric (IMD) layer consisting of layers 20, 22 and 24. In this total etched back process, in which the SOG is etched back to the insulating barrier layer surface 20, the contact openings, such as opening 5 depicted in FIG. 4, are formed totally within the PECVD oxides (layers 20 and 24), and thereby avoids the corrosive effects of the SOG on the next level of metal interconnections that extends into the contact opening.

The preferred spin-on-glass consist of a silicon-oxide (Si-O) network polymer dissolved in a common organic solvent, such as alcohol, ketones and esters. For example, the spin-on-glass material can be one of a series of siloxane base material marketed by the Allied-Signal Corp of Milpitas, Calif., under the trade name ACCUGLASS. The spin-on-glass is spin coated on the substrate using a spin coating technique commonly used in the semiconductor industry for applying photoresist on substrates. For example, to achieve a SOG layer about 6000 Angstroms thick, a double layer spin coating is commonly used, whereby the spin coating is applied in three layers each being about 3000 Angstroms in thickness. The spin-on-glass is usually baked after each coating at an elevated temperature of about 425° C. to drive off the solvents, reduce cracking and improve the planarity. The total thickness of the SOG layer will depend on the roughness of the underlying topography, but is generally in the range between about 1000 to 12000 Angstroms.

The conventional etch back of the spin-on-glass is usually carried out in a single etch back step. Typically, to achieve a planar surface when the SOG is etched back exposing the surface of the insulating barrier layer 20, it is necessary to have a etch rate selective for the barrier layer (PECVD oxide) to the SOG of between about 1.3 to 1.9, and more specifically a value of 1.6. This is to compensate for the micro- or local-loading effects that occur at the surfaces of the closely spaced insulators over the regions of the closely spaced metal lines. This etch selectivity on blanket coated wafers thereby provides the necessary etch selectivity of about 1:1 at the patterned wafer surface. To achieve this high selectivity a high polymer chemistry gas mixture, such as $CHF_3$ and $CF_4$, is used to inhibit the etch rate of the SOG relative to the PECVD oxide. Unfortunately, as the ratio of $CHF_3$ gas flow to the $CF_4$ gas flow is increased to achieve higher etch rate selectivity the etch rate uniformity across the wafer is poor and further deteriorates with increasing etch rate selectivity. This is clearly seen in TABLE I in which column A is a series of flow rates of $CF_4$ and $CHF_3$ in standard cubic centimeters per minute (sccm) expressed as ratios, column B is the total etch back which in this particular example is 7000 Angstroms, column C is the etch rate selectivity (ratio) of PECVD oxide to SOG, column D is the total variation in etch uniformity measured in Angstroms, and column E is the percent of variation in uniformity about the nominal thickness. As seen in the TABLE I, the ratio of $CF_4/CHF_3$ decreases from 40/100 to 20/100 (rows 1 through 3) the selectivity due to increased polymeric build-up increases from 1.3 to 1.9 as desired, but the etch uniformity across the substrate deteriorates from 10% to 16%. Also shown in TABLE I (rows 4, 5 and 6) is the etch selectivity and etch uniformity dependence on $CF_4/CHF_3$ flow ratio at lower total flow rates. As is seen there is no significant improvement by changing the total flow rate. This etch rate selectivity vs etch uniformity is also depicted in FIG. 2 previously discussed.

TABLE I

CORRELATIONS BETWEEN SOG ETCH BACK UNIFORMITY AND $CF_4/CHF_3$ GAS RATIO

| | A $CF_4/$ $CHF_3$ GAS RATIO (IN SCCM) | B ETCH BACK (KA) | C ETCH RATE RATIO OF PECVD TO SOG | D ETCH UNI- FORMITY (ANG- STROMS) | E PERCENT UNIFOR- MITY |
|---|---|---|---|---|---|
| 1 | 40/100 | 7.0 | 1.3 | 1400 | 10% |
| 2 | 30/100 | 7.0 | 1.6 | 1820 | 13% |
| 3 | 20/100 | 7.0 | 1.9 | 2240 | 16% |
| 4 | 30/50 | 7.0 | 1.2 | 1400 | 10% |
| 5 | 20/50 | 7.0 | 1.4 | 1680 | 12% |
| 6 | 15/50 | 7.0 | 1.6 | 2100 | 15% |

Figure 5:
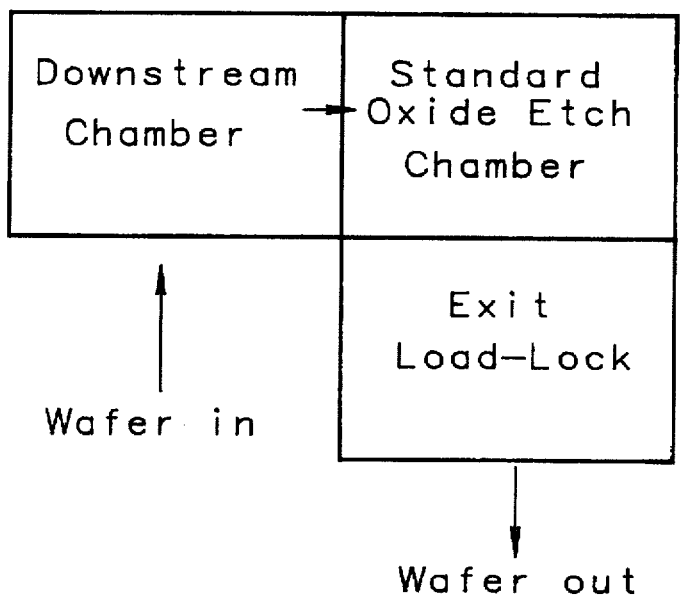
FIG. 5 is a block diagram showing the two step etch back process, by the method of this invention, for improving the etch back uniformity while retaining a good etch selectivity between the insulating barrier layer and SOG.
Figure 6:
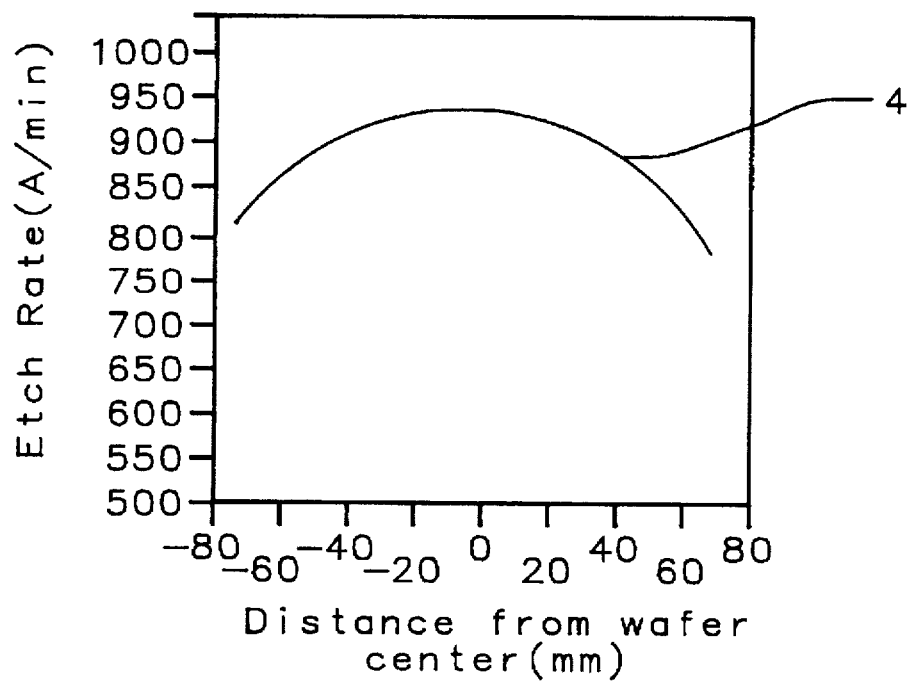
FIG. 6 is a plot of the etch rate profile across a wafer in a downstream etcher showing the slower etch rate at the wafer perimeter.
Figure 7:
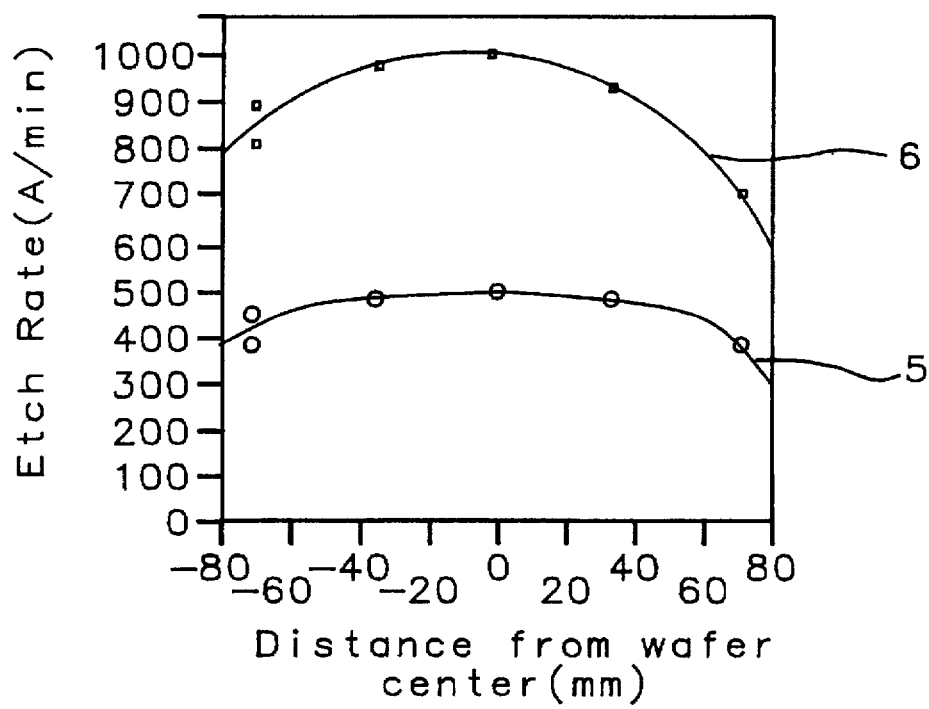
FIG. 7 is a plot of the etch rate profile across a wafer in the downstream etcher for two different gas flow rates.

Referring now more specifically to FIG. 5 through 10, the embodiment of this invention is now described in detail for providing a two step etch back with improved etch uniformity across the wafer while providing the required PECVD oxide to SOG etch rate selectivity. The etching sequence is depicted in FIG. 5. The wafer or substrate having the spin-on-glass coating is etched first in a single wafer plasma etcher having a convex etch profile across the wafer. The preferred etching system is a downstream etcher in which the reactive etch gases are plasma produced in a region of the gas inlet tube or chamber prior to entering the etch chamber in which the wafer is etched. For example, one type of downstream etcher is the TEL 5000 ATC model manufacture by Tokyo Electronics Ltd. of Japan. A typical etch rate profile for one of these type of downstream etchers is shown in FIG. 6 for a wafer having a 150 millimeter (mm) diameter. FIG. 6 shows a curve 1 of the etch rate in Angstroms/minute vs the distance in millimeters across the wafer for a typical downstream etcher. More specifically two etch rate profiles for SOG in a TEL 5000 is shown in FIG. 7 for etching in a $CF_4/O_2$ gas mixture. The etch profile curve 5 is for a $CF_4$ flow rate of 10 sccm and the upper curve 6 is for a $CF_4$ flow rate of 25 sccm. The other etch parameters were the same for the curves, that is the radio frequency power was between about 270 to 330 Watts and more specifically having a power of 300 Watts, the total pressure was between about 1400 to 1600 and more specifically about 1500 millitort, and the oxygen flow rate was between 140 to 160 sccm and more specifically having a flow rate of 150 sccm. As can be seen from the etch rate profile curve 5 and 6 in FIG. 7, the etch rate is slower at the perimeter of the wafer, and the etch rate variation across the wafer is between about 15 to 19%. This results in a SOG profile across the diameter of the wafer which is convex in shape having a significantly thicker SOG at the perimeter of the wafer. The SOG is partially etched back. For example, if the total SOG thickness is between about 7000 to 8000 Angstroms thick then the SOG is etched back between about 1600 to 2000 Angstroms. The etch selectivity between the PECVD oxide and the SOG is not important at this step since the PECVD oxide is not yet exposed.

Figure 8:
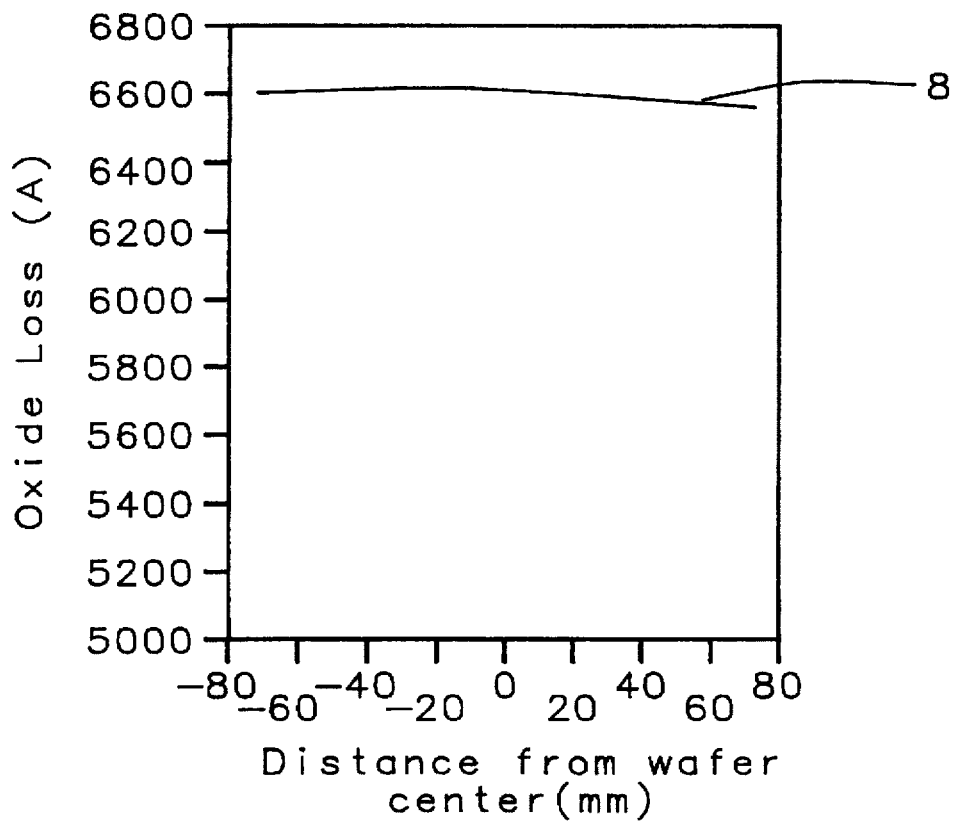
FIG. 8 is a plot of the final oxide loss (total oxide removed) across the wafer by the two step method of this invention showing a much improved uniformity.

Referring again to FIG. 5, the partially etched wafer is now loaded into a standard oxide etcher having an etch rate profile across the wafer that increases from center to edge of wafer (concave etch profile). The remaining SOG is then etched back to the insulating barrier layer 20 (PECVD oxide) shown in FIG. 4, providing an essentially planar suface with SOG filling the recesses. This second etch back is preferably performed in a plasma etchers, such as a reactive ion etcher (RIE). For example one type of etcher is a model LAM 4520 etcher manufactured by the LAM Research Corporation of Calif. The preferred etching is carried out using a high polymer chemistry etch gas, such as a mixture of trifluoromethane ($CHF_3$) and carbon tetrafluoride ($CF_4$) so as to provide the required etch selectivity between the SOG and PECVD oxide. The convex etch profile (thicker SOG on the wafer perimeter) from the first etch step now compensates for the concave etch rate from the second etch back to form an essentially uniform etch back when the SOG is etched to the barrier layer 20. A typical etch back profile after the second etch back is shown in FIG. 8 (curve 8) in which a total of about 6600 Angstroms of SOG is removed. As can be seen by curve 8 the etch back uniformity across the wafer, by the method of this invention, is quite uniform. A more detailed description of the convex/concave etch back is provided in the EXAMPLES.

The second etch back in the LAM 4520 is preferably performed at a radio frequency (RF) power of between about 450 to 550 Watts, and more specifically at a power of 500 Watts. The total gas pressure in the etch chamber is between about 270 to 330 millitorr, and more specifically at a pressure of 300 millitort. The preferred flow rates for the $CF_4$ and $CHF_3$ are, respectively, 20 sccm for $CF_4$ and 50 sccm for the $CHF_3$. However, the flow rates and flow rate ratios can be varied, as indicated in TABLE I to achieve the desired etch rate selectivity, and the amount of SOG etch back in each step can be varied to obtain the best etch uniformity across the wafers. Althought the two etch back steps can be performed in separate stand-alone etchers, the preferred method is to use a multichamber system, often referred to as a cluster tool, to minmize the process time and avoid contamination during transfer of the wafers.

To better understand and appreciate the method of this invention for improving the etch uniformity across the wafer a number of EXAMPLES are now given.

EXAMPLES

Figure 9:
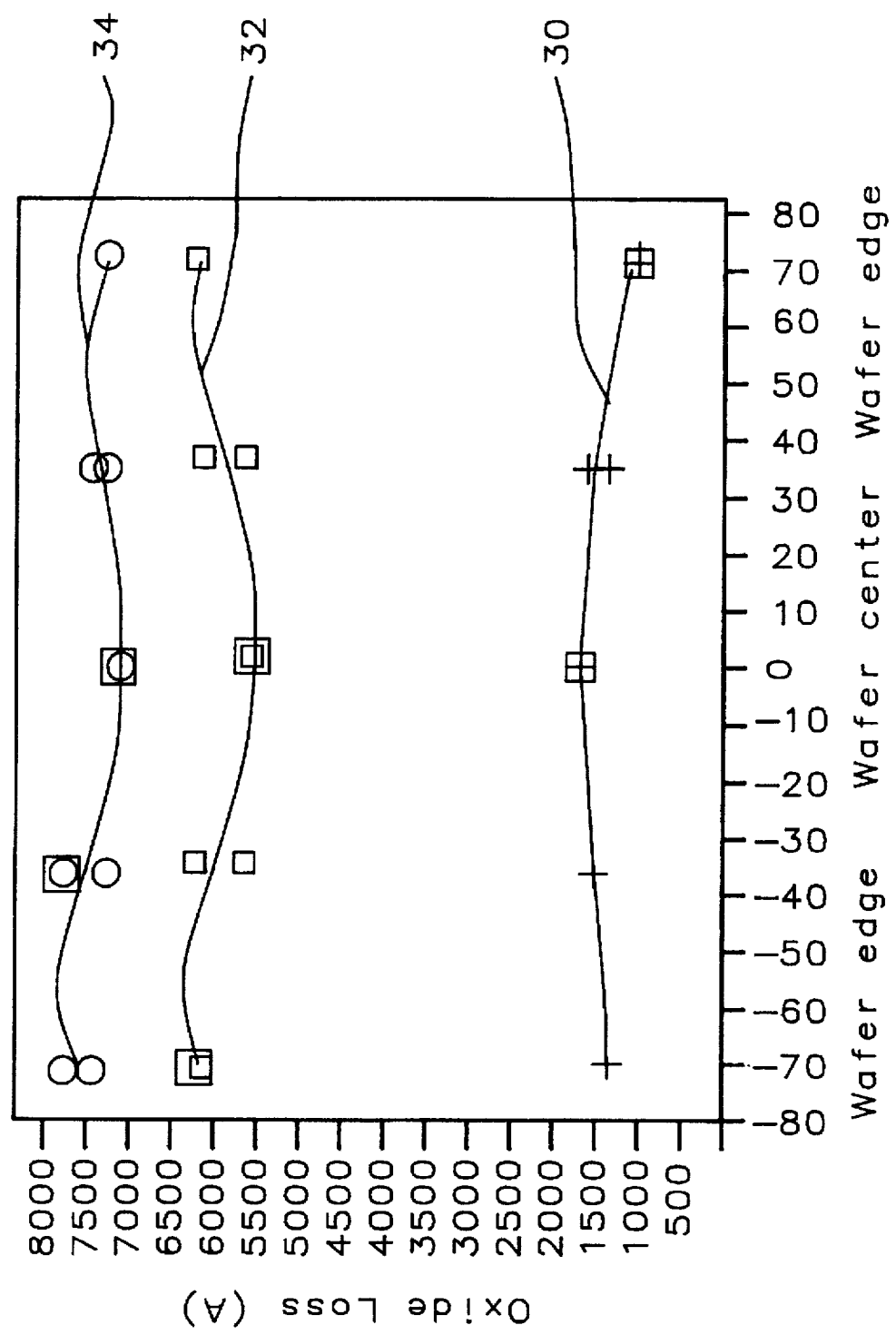
FIG. 9 is the experimental results for the SOG etch back showing the etch back uniformity after the first etch back steps and after the second etch back step. The FIG. 9 also shows the etch back profile for the conventional single etch back.
Figure 10:
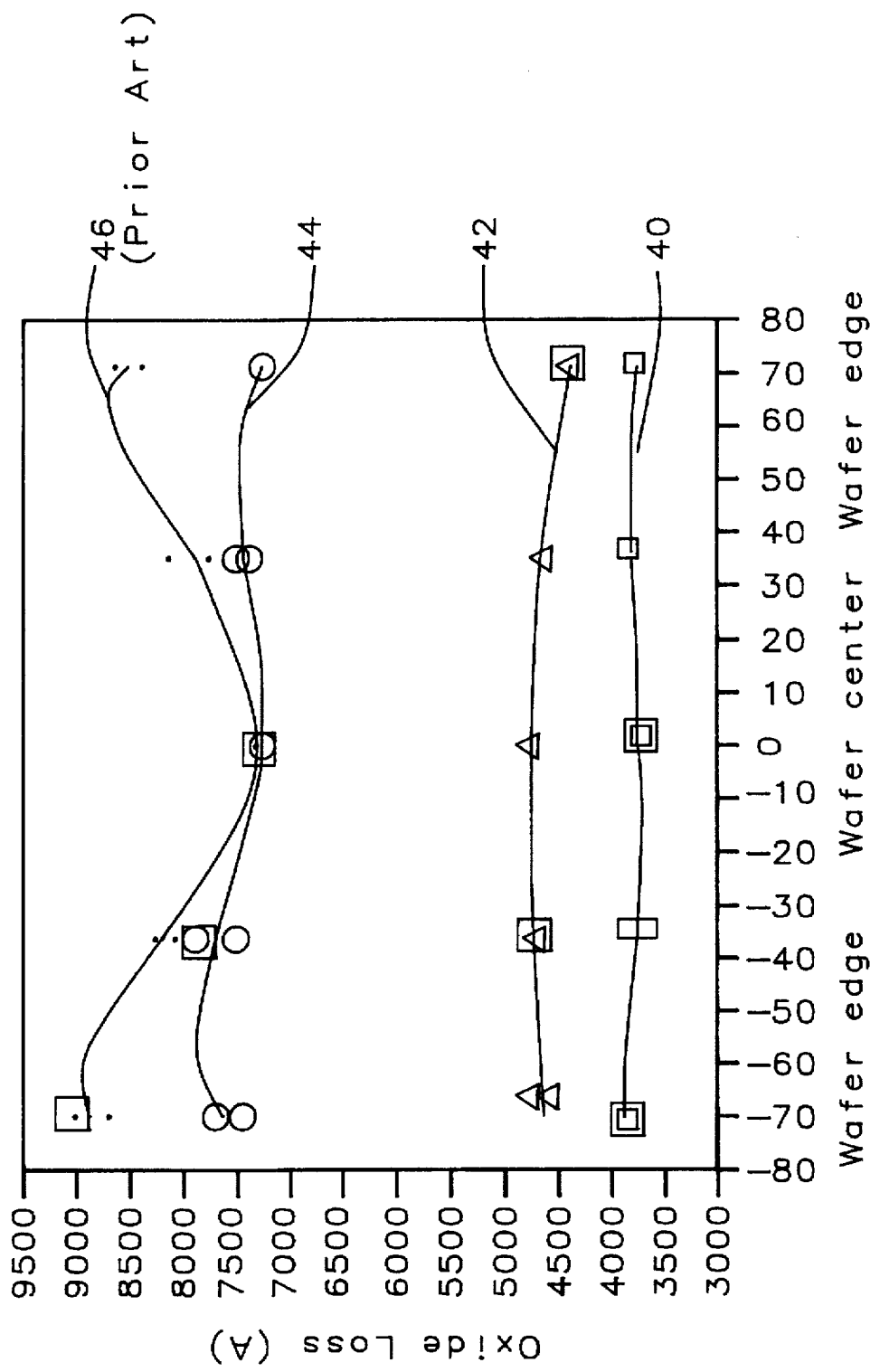
FIG. 10 shows a comparison of the etch back uniformity profiles for the conventional single etch back and the two step convex/concave etch back of this invention. The results are compared for two different etch back depths.
Figure 11:
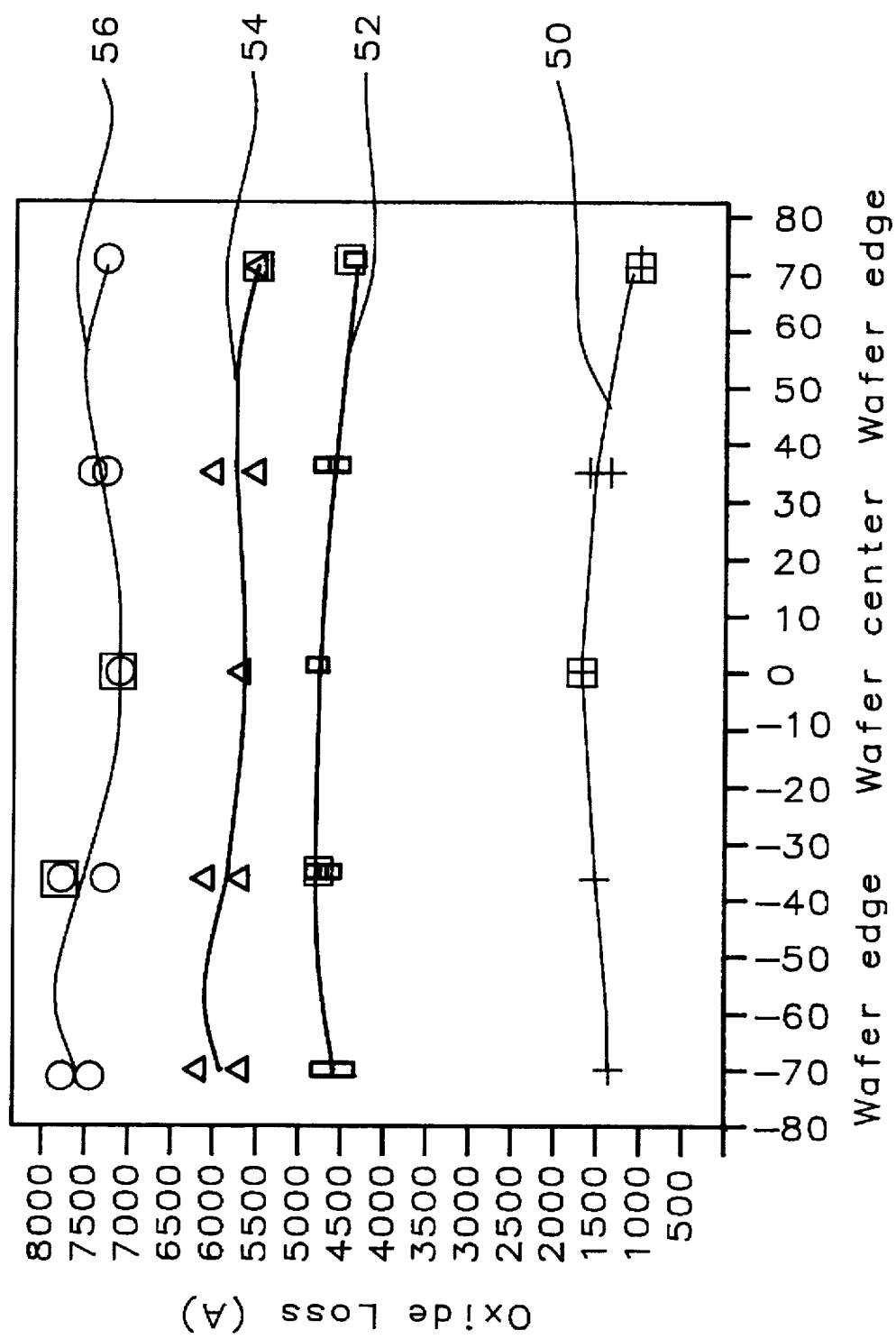
FIG. 11 is the experimental results of this invention showing the etch back after the first etch back in the downstream etcher and after consecutive increasing etch times for the second etch back in the reactive ion etcher. The results show the excellent uniformity tolerance to etch times.

The test wafers used for these etch uniformity experiments consist of bare silicon wafer having a diameter of 160 millimeter. The wafers were spin coated with spin-on-glass of the siloxane type SOG 314 manufactured by the Allied Signal Inc. of Sanata Clara, Calif. and cured at a temperature of 425° C. for 760 minutes. The total thickness of the SOG on the wafer after curing was measured to be greater than 6000 Angstroms. The desired thick coatings were achieve by multiple coating, as previously described. FIGS. 9–11 are plots of the etch uniformity across the diameter of the wafers after etch back. The etch uniformity is measured as an oxide loss in Angstroms (thickness of SOG removed by etching). The percent of variation in etch uniformity quoted in the EXAMPLES is determined by the conventional method of dividing the difference between the high and low thickness measurements by the sum of the high and low values and then multiplying by 100. The SOG thickness was measured using an optical thickness measuring instrument model Prometrix manufactured by Tencor Instruments of Santa Clara, Calif.

EXAMPLE 1

Shown in FIG. 9. is a series of curves comparing the two step process of this invention with a single step method of the prior art. Curve 30 in FIG. 9 shows the SOG removed (etched off) after the first of the two etch backs using the downstream etcher (ATC 5000). The etch was carried out in a gas mixture of $CF_4$ and $O_2$ having a flow rate of 25 and 150 sccm, respectively. The etching was done at a RF power of 300 Watts and a pressure of 1500 mTorr. After an etch back of 1454 Angstroms taking 105 seconds (sec.) the SOG removed at the perimeter of the wafer is less than at the center, thereby leaving a SOG on the wafer having a convex profile. The etch uniformity across the wafer was 21%. The same SOG layer was etched back a second time, as shown by curve 34 in FIG. 9, using a LAM oxide etcher which has a higher etch rate at the wafer perimeter and thereby provides a concave etch profile. The slow etching at the perimeter of the wafer in the downstream etching in the first step therefore compensates for the LAM higher etch rate at the wafer perimeter, and thereby provides a much improved etch profile having a final etch uniformity of only 4%. The total etch back after both etch steps was 7435 Angstroms with a variation of 555 Angstroms. The etching parameters in the LAM 4520 etcher was etched in a gas mixture of $CF_4/CHF_3$ having a flow rate of 20 and 50 sccm respectively. The RF power was 500 Watts, and the chamber pressure during etching was 300 mTorr. The second etch was for a time of 100 seconds. For comparison the profile for a conventional single etch back step process is shown as curve labeled 32 in FIG. 9. The etch back conditions for the conventional etch back were identical to the second etch back step used by the method of this invention. The SOG removed during the conventional single step etch back was 5980 Angstroms and the total etch variation in Angstroms at this thickness was 824 Angstroms which is about a 7 percent variation and considerably greater than the 4.0% achieved by the two step process.

EXAMPLE 2

FIG. 10 shows another etch back comparison between the two step (convex/concave) etch back process of this invention and the more conventional method using the single etch back. The test wafers and etching parameters are the same as in EXAMPLE 1 except for the etch times. Curve 40 is the uniformity profile for a conventional single etch back removing 3855 Angstroms of SOG in 80 seconds in the LAM etcher. The etch back uniformity was 192 Angstroms or about 3 percent. Curve 42 is the etch uniformity for the two step etch back by the method of this invention which was etched back a total of 4581 Angstroms using a 105 second etch in the ATC downstream etcher and 60 second in the LAM etcher. The etch back uniformity was 342 Angstroms or about 4 percent, and comparable to the single step etch. However, as the etch back time is increased to remove thicker SOG layers on wafers for improved planarization, the conventional single etch back uniformity degrades rapidly due to the polymer build-up at the center of the wafer as described in the prior art and depicted in FIGS. 1 and 2. This poor uniformity is apparent in curve 46 where the conventional single etch back is carrier out for 160 seconds removing about 8700 Angstroms of SOG. The etch back uniformity is 1834 Angstroms or about 12 percent. For comparison the curve 44 in FIG. 10 using the two step (convex/concave) etch back process of this invention is also shown. The etching was carried out for 105 seconds in the downstream (ATC) etcher and for 100 seconds in the LAM etcher removing an average of 7435 Angstroms. The variation in etch uniformity was 555 Angstroms across the wafer or about 4 percent, and is a significant improvement over the conventional process.

EXAMPLE 3

A final example is shown in FIG. 11 in which the large latitude in etch back is demonstrated for the two step etch back process, of this invention, without degrading the etch back uniformity as was shown to occur for the conventional process in FIG. 10. The preparation of the test wafers and the etch back parameters for this EXAMPLE are identical to the previous EXAMPLES. The etch times were varied to demonstrate the independence of the etch back uniformity on etch time which provides a very manufacturable process. The etch back uniformity of the SOG layer is shown by curve 50 is a plot of the SOG etch back uniformity across the wafer (SOG removed) after the first etch back in the downstream (ATC) etcher which removed 1454 Angstroms of SOG in 105 seconds. As is apparent in FIG. 11, the etch rate at the wafer perimeter is lower than at the center and results in a convex profile in the SOG on the wafer having a etch back uniformity of about 21 percent. Now shown by curves 52, 54 and 56 in FIG. 11 is the profiles after the second etch back step carried out in the LAM etcher for increasing times after the first etch back (curve 50). Curve 52 is the etch back profile after an additional 60 second etch which removed an average of 4581 Angstroms of SOG. The amount removed includes the original 1454 Angstroms removed by the first etch. The total variation in uniformity across the wafer was measured to be 342 or about 4 percent. When the second etch back in the LAM etcher was increase to 80 seconds, as shown by curve 54 in FIG. 11, the total SOG removed by both the first and second etch step was 5760 Angstroms, and the total variation in uniformity across the wafer was 509 Angstroms or about 4.4 percent. The final etch back profile, shown as curve 56 in FIG. 11, is for an additional 100 seconds in the LAM etcher in which a total of 7435 Angstroms was etched away and the variation across the wafer was 555 Angstroms or also about 4 percent. This clearly demonstrates the excellent etch back uniformity and the independence on the etch back thickness, hence etch time, thereby providing an ideal manufacturing process.

While the invention has been particularly shown and described with reference to the preferred embodiments thereof, it will be understood by those skilled in the art that various changes in form and details may be made without departing from the spirit and scope of the invention.

What is claimed is:

1. A method for improving the etch back uniformity for an inter-metal-dielectric (IMD) layer on a semiconductor substrate over a patterned electrically conducting layer, comprising the steps of:

providing a partially completed semiconductor substrate having semiconductor devices formed in and on said substrate surface, and further having a patterned electrically conducting layer electrically interconnecting said semiconductor devices;

depositing a conformal insulating barrier layer over said patterned conducting layer, and elsewhere on said substrate;

coating a spin-on-glass (SOG) on said insulating barrier layer, and thereby filling recesses formed by said patterned electrically conducting layer on said substrate;

baking said spin-on-glass layer, and thereby out gassing and curing said spin-on-glass layer;

repeating said coating of said spin-on-glass and said curing to provide a sufficiently thick spin-on-glass layer to form a planar surface over said recesses;

etching back partially said spin-on-glass (SOG) layer, using a first etch back having an etch rate profile across said substrate wherein said etch rate decreases from the center to the perimeter of said substrate, thereby said remaining SOG layer increases in thickness from center to said perimeter of said substrate, thereby said SOG layer having a convex shape;

etching back said SOG layer to the surface of said insulating barrier layer over said patterned electrically conducting layer using a second etch back having a etch rate profile across said substrate which increases in etch rate from said center to said perimeter of said substrate, said second etch back forming a planarized surface, with the surface of said SOG in said recesses coplanar with the surface of said insulating barrier layer, and thereby completing said improved etch back for said inter-metal-dielectric layer.

2. The method of claim 1, wherein the thickness of said patterned conducting layer is between about 4000 to 8000 Angstroms.

3. The method of claim 1, wherein said insulating barrier layer is composed of silicon oxide having a thickness from between about 7000 to 14000 Angstroms.

4. The method of claim 1, wherein said spin-on-glass is a multiple coating of a siloxane type having a total thickness of between about 3000 to 7000 Angstroms.

5. The method of claim 1, wherein said first etch back is performed in a downstream plasma etcher.

6. The method of claim 5, wherein the etch gas mixture used in said downstream etcher is carbon tetrafluoride ($CF_4$) and oxygen ($O_2$).

7. The method of claim 1, wherein said second etch back is performed in a reactive ion etcher (RIE).

8. The method of claim 7, wherein the etching gas mixture used in said reactive ion etcher is trifluoromethane ($CF_3H$) and carbon tetrafluoride ($CF_4$).

9. The method of claim 1, wherein the etch rate ratio of said insulating barrier layer to said spin-on-glass is between about 1.2 to 1.9, for said second etch back.

10. A method for improving the etch back uniformity for an inter-metal-dielectric (IMD) layer on a semiconductor substrate over a patterned conducting layer, comprising the steps of:

providing a partially completed semiconductor substrate having semiconductor devices formed in and on said substrate surface, and further having a patterned conducting layer electrically interconnecting said semiconductor devices;

depositing a conformal insulating barrier layer over said patterned conducting layer, and elsewhere on said substrate, said insulating barrier layer composed of silicon oxide ($SiO_2$);

coating a spin-on-glass (SOG) layer on said first insulating layer, and thereby filling recesses formed by said patterned conducting layer on said substrate;

baking said first spin-on-glass layer, and thereby out gassing and curing said spin-on-glass layer;

repeating said coating of said spin-on-glass and said curing to provide a sufficiently thick spin-on-glass layer to form a planar surface over said recesses;

etching back partially said spin-on-glass (SOG) layer, using a first etch back in a downstream plasma etcher, thereby said remaining SOG layer increases in thickness from center to perimeter of said substrate;

etching back said SOG layer to the surface of said insulating barrier layer over said patterned conducting layer using a second etch back in a reactive ion etcher, said etch back forming a planarized surface, with said surface of said SOG in said recesses coplanar with the surface of said insulating barrier layer, and thereby completing said improved etch back of said spin-on-glass layer.

11. The method of claim 10, wherein the thickness of said patterned conducting layer is between about 4000 to 8000 Angstroms.

12. The method of claim 10, wherein said silicon oxide barrier layer is deposited by chemical vapor deposition (CVD).

13. The method of claim 10, wherein said spin-on-glass is a multiple coating of a siloxane type having a total thickness of between about 3000 to 7000 Angstroms.

14. The method of claim 10, wherein the etch gas mixture used in said downstream etcher is carbon tetrafluoride ($CF_4$) and oxygen ($O_2$).

15. The method of claim 10, wherein the etching gas mixture used in said reactive ion etcher is trifluoromethane ($CF_3H$) and carbon tetrafluoride ($CF_4$).

16. A method for forming a planar inter-metal-dielectric layer on a patterned electrically conducting layer on a substrate, comprising the steps of:

providing a semiconductor substrate having semiconductor devices formed in and on said substrate surface;

depositing an electrically conducting layer;

patterning said electrically conducting layer by masking and anisotropic plasma etching, thereby electrically interconnecting said semiconductor devices;

depositing a conformal insulating barrier layer over said patterned conducting layer, and elsewhere on said substrate;

coating a spin-on-glass (SOG) on said insulating layer, and thereby filling recesses formed by said patterned conducting layer on said substrate;

baking said first spin-on-glass layer, and thereby out gassing and curing said spin-on-glass layer;

repeating said coating of said spin-on-glass and said curing to provide a sufficiently thick spin-on-glass layer to form a planar surface over said recesses;

etching back partially said spin-on-glass (SOG), using a first etch back etch rate profile across said substrate wherein said etch rate decreases from the center to the perimeter of said substrate, thereby said remaining SOG layer increases in thickness from center to said perimeter of said substrate, thereby said SOG layer having a convex shape;

etching back said SOG layer to the surface of said first insulating barrier layer over said patterned conducting layer using a second etch back having a etch rate profile across said substrate which increases in etch rate from said center to said perimeter of said said substrate, said second etch back forming a planarized surface, the surface of said SOG in said recesses being coplanar with the surface of said insulating barrier layer, depositing a second insulating barrier layer on said SOG and said insulating barrier layer, and thereby providing a planar surface for subsequent patterned electrically conducting layers.

17. The method of claim 16, wherein said spin-on-glass is a multiple coating of a siloxane type having a total thickness of between about 3000 to 7000 Angstroms.

18. The method of claim 16 wherein said first etch back is performed in a downstream plasma etcher.

19. The method of claim 18, wherein the etch gas mixture used in said downstream etcher is carbon tetrafluoride ($CF_4$) and oxygen ($O_2$).

20. The method of claim 16 wherein said second etch back is performed in a reactive ion etcher (RIE).

21. The method of claim 20, wherein the etching gas mixture used in said reactive ion etcher is trifluoromethane ($CF_3H$) and carbon tetrafluoride ($CF_4$).

22. The method of claim 16, wherein the etch rate ratio of said insulating barrier layer to said spin-on-glass is between about 1.2 to 1.9.

* * * * *

UNITED STATES PATENT AND TRADEMARK OFFICE
CERTIFICATE OF CORRECTION

PATENT NO. : 5,639,345
DATED : June 17, 1997
INVENTOR(S) : Yuan-Chang Huang
Chen-Hua Douglas Yu It is certified that error appears in the above-indentified patent and that said Letters Patent is hereby corrected as shown below: Title page:

Item (75), correct inventor's name from "Yu Chen-Hua Douglas" to --Chen-Hua Douglas Yu--

Signed and Sealed this

Twenty-sixth Day of August, 1997

Attest:

BRUCE LEHMAN

Attesting Officer

Commissioner of Patents and Trademarks